United States Patent
Lee et al.

(10) Patent No.: US 11,444,617 B2
(45) Date of Patent: Sep. 13, 2022

(54) SET AND RESET PULSE GENERATOR CIRCUIT

(71) Applicant: SEMICONDUCTOR COMPONENTS INDUSTRIES, LLC, Phoenix, AZ (US)

(72) Inventors: Kyoung Min Lee, Mountain Top, PA (US); Kaitlyn Sitch, Weatherly, PA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 1001 days.

(21) Appl. No.: 15/728,182

(22) Filed: Oct. 9, 2017

(65) Prior Publication Data

US 2018/0159527 A1 Jun. 7, 2018

Related U.S. Application Data

(60) Provisional application No. 62/429,465, filed on Dec. 2, 2016.

(51) Int. Cl.
| | |
|---|---|
| *H03K 17/22* | (2006.01) |
| *H03K 5/1534* | (2006.01) |
| *H03K 3/037* | (2006.01) |
| *H03K 5/15* | (2006.01) |
| *H03K 3/0233* | (2006.01) |
| *H03K 19/20* | (2006.01) |

(52) U.S. Cl.
CPC ......... *H03K 17/223* (2013.01); *H03K 3/0233* (2013.01); *H03K 3/037* (2013.01); *H03K 5/15* (2013.01); *H03K 5/1534* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 6,903,590 B2 | 6/2005 | Indoh | |
| 7,283,005 B2* | 10/2007 | Confalonieri | H03K 5/133 331/2 |
| 8,564,363 B1* | 10/2013 | Wang | H03K 5/1252 327/333 |
| 9,184,664 B2* | 11/2015 | Saji | H03K 7/08 |
| 9,362,755 B2* | 6/2016 | Khandelwal | H03K 5/1532 |
| 9,831,867 B1* | 11/2017 | Kinzer | H03K 19/017509 |

(Continued)

*Primary Examiner* — Menatoallah Youssef
*Assistant Examiner* — Khareem E Almo
(74) *Attorney, Agent, or Firm* — Dickinson Wright PLLC; Mark E. Scott

(57) ABSTRACT

A set and reset pulse generator circuit receives an input signal to generate a set signal and a reset signal pair. The set and reset pulse generator circuit includes a set circuit and a reset circuit. A cross-coupling circuit connects a voltage signal of the reset circuit to an output circuit of the set circuit, and another cross-coupling circuit connects a voltage signal of the set circuit to an output circuit of the reset circuit. The output circuit of the set circuit generates the set signal from the input signal, the voltage signal of the reset circuit, and the voltage signal of the set circuit. The output circuit of the reset circuit generates the reset signal from an inverted input signal, the voltage signal of the reset circuit, and the voltage signal of the set circuit.

19 Claims, 2 Drawing Sheets

(56) References Cited

U.S. PATENT DOCUMENTS

| | | |
|---|---|---|
| 10,187,053 B1 * | 1/2019 | Song .................. H03K 17/08 |
| 2007/0223154 A1 | 9/2007 | Locatelli et al. |
| 2010/0164579 A1 * | 7/2010 | Acatrinei ............ H02M 1/4208 |
| | | 327/172 |
| 2011/0248750 A1 * | 10/2011 | Seo ..................... G06F 13/4072 |
| | | 327/108 |
| 2016/0049922 A1 * | 2/2016 | Sanchez ............. G11C 11/4093 |
| | | 327/308 |
| 2016/0056813 A1 * | 2/2016 | Vice ..................... H03K 17/602 |
| | | 330/297 |
| 2016/0072485 A1 * | 3/2016 | Vice ........................ H03K 6/04 |
| | | 330/296 |
| 2017/0288672 A1 * | 10/2017 | Schemm ........ H03K 19/018507 |
| 2019/0074830 A1 * | 3/2019 | Mirabella .............. H03K 3/037 |
| 2019/0081619 A1 * | 3/2019 | Kim ..................... H03K 5/1565 |

* cited by examiner

SET AND RESET PULSE GENERATOR CIRCUIT

CROSS-REFERENCE TO RELATED APPLICATION

This application claims the benefit of U.S. Provisional Application No. 62/429,465, filed Dec. 2, 2016, which is incorporated herein by reference in its entirety.

BACKGROUND OF THE INVENTION

1. Field of the Invention

The present invention relates generally to electrical circuits, and more particularly but not exclusively to set and reset pulse generator circuits.

2. Description of the Background Art

Set and reset pulse generator circuits are widely used in a variety of systems and applications. A typical set and reset pulse generator circuit includes switches and capacitor circuits that are charged and discharged around a threshold to generate a set signal and a complementary reset signal for a given input signal. The input signal to the circuit is either logic high or low. In some implementations, when an input signal is a pulse signal that has a very short duration, conventional set and reset pulse generator circuits may drop a reset or set signal. Dropping a set and/or reset signal may have negative effects on circuits and/or systems downstream, and may present dangerous conditions in high voltage environments. One attempt to overcome these issues is to adjust the switch characteristics to enable faster charging of capacitors. However, this is an incomplete solution due to, among other things, process variation of switch devices. Another attempt to overcome these issues is to include additional circuits (e.g., low pass circuit) to the set and reset pulse generator circuit. However, such circuit introduces lag (delay) which may be unusable in some operating environments and increases component count which may increase the footprint and/or cost of the circuit.

SUMMARY

In one embodiment, a set and reset pulse generator circuit receives an input signal to generate a set signal and a reset signal pair. The set and reset pulse generator circuit may comprise a set circuit and a reset circuit. A first cross-coupling circuit connects a voltage signal of the reset circuit to an output circuit of the set circuit, and a second cross-coupling circuit connects a voltage signal of the set circuit to an output circuit of the reset circuit. The output circuit of the set circuit generates the set signal from the input signal, the voltage signal of the reset circuit, and the voltage signal of the set circuit. The output circuit of the reset circuit generates the reset signal from an inverted input signal, the voltage signal of the reset circuit, and the voltage signal of the set circuit.

The set circuit may include a first transistor pair that is switched according to the input signal to charge a first capacitor to generate the voltage signal of the set circuit. The reset circuit may include a second transistor pair that is switched according to the inverted input signal to charge a second capacitor to generate the voltage signal of the reset circuit.

The output circuit of the set circuit may generate the set signal by performing a logical And operation on the input signal, the voltage signal of the set circuit, and the voltage signal of the reset circuit. The output circuit of the reset circuit may generate the reset signal by performing a logical And operation on the inverted input signal, the voltage signal of the reset circuit, and the voltage signal of the set circuit.

The first and second transistor pairs may each comprise a PMOS transistor and and an NMOS transistor.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
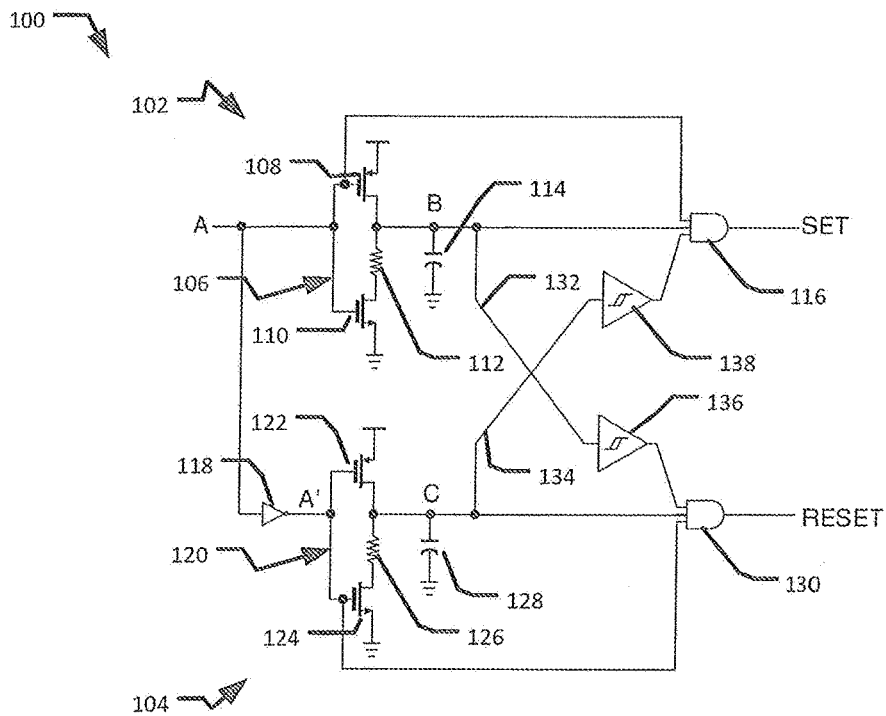
FIG. 1 shows a schematic diagram of a set and reset pulse generator circuit in accordance with an embodiment of the present invention.

FIG. 1 shows a schematic diagram of a set and reset pulse generator circuit 100 ("SR circuit 100") in accordance with an embodiment of the present invention. The SR circuit 100 may be configured to generate a pair of set/reset pulses for a given input signal pulse.

In the example of FIG. 1, the SR circuit 100 includes a set circuit 102 and a reset circuit 104 that are configured to receive an input signal A and generate a set signal and a complementary reset signal in accordance with the input signal A. The input signal A may be a logic signal that transitions between a logic high and a logic low. The SR circuit 100 may be employed in a wide variety of circuits to generate a set signal and a reset signal.

In the example of FIG. 1, the set circuit 102 includes an inverter circuit 106 that includes switch elements 108 and 110 and a resistive element 112. The switch element 108 may be a P-type metal oxide semiconductor (PMOS) transistor having a gate that is coupled to the input signal A, a source that is coupled to a rail voltage source (e.g., VCC), and a drain that is coupled to a node B. The switch element 110 may be an N-type metal oxide semiconductor (NMOS) transistor having a gate that is coupled to the input signal A, a source that is coupled to a reference node (e.g., ground), and a drain that is coupled to the node B via the resistive element 112.

In the example of FIG. 1, the set circuit 102 further includes a capacitor 114 coupled between the node B and the reference node. When the input signal A is in a logic low state, the PMOS transistor 108 is ON (conducting), the NMOS transistor 110 is OFF (non-conducting), and the capacitor 114 is charging. When the input signal A is in a logic high state, the PMOS transistor 108 is OFF (non-conducting), the NMOS transistor is ON (conducting), and the capacitor 114 is discharged through the resistive element 112. Thus, the resistive element 112 generally controls discharging of the capacitor 114 to be slower than charging of the capacitor 114.

In the example of FIG. 1, the set circuit 102 further includes an output circuit in the form of an And gate 116 that is configured to receive the input signal A, the voltage on the capacitor 114 at the node B, and an input from the reset circuit 104. The And gate 116 may have an associated input threshold, above which is defined as a logic "1" or high, and below which is defined as a logic "0" or low. The output of the And gate 116 is a set signal that may be used, for example, with other logic circuits (e.g., flip-flop circuit) as will be appreciated by one skilled in the art.

In the example of FIG. 1, the reset circuit 104 is similar to the set circuit 102, and includes an inverter buffer 118 to generate an inverted input signal A'. The reset circuit 104 also includes an inverter circuit 120 that includes switch elements 122 and 124 and a resistive element 126. The switch element 122 may be a PMOS transistor having a gate that is coupled to receive the inverted input signal A', a source that is coupled to a rail voltage source (e.g., VCC) and a drain that is coupled to a node C. The switch element 124 may be an NMOS transistor having a gate that is coupled to receive the inverted input signal A', a source that is coupled to a reference node (e.g., ground), and a drain that is coupled to the node C via the resistive element 126.

As can be appreciated, the switch elements of the inverter circuits 106 and 120 may be replaced with other types of transistors depending on the application. For example, the switch elements 108 and 122 may be any suitable transistor that can serve as a pull-up transistor, such as a PNP bipolar junction transistor (BJT). As another example, the switch elements 110 and 124 may be replaced with any suitable transistor that can serve as a pull-down transistor, such as an NPN bipolar junction transistor.

In the example of FIG. 1, the reset circuit 104 further includes a capacitor 128 coupled between the node C and the reference node. When the inverted input signal A' is in a logic low state, the PMOS transistor 122 is ON (conducting) and the NMOS transistor 124 is OFF (non-conducting), and the capacitor 128 is charging. When the inverted input signal A' is in a logic high state, the PMOS transistor 122 is OFF (non-conducting), the NMOS transistor 124 is ON (conducting), and the capacitor 128 is discharging through the resistive element 126. Thus, the resistive element 126 generally controls discharging of the capacitor 128 to be slower than charging of the capacitor 128.

In the example of FIG. 1, the reset circuit 104 further includes an output circuit in the form of an And gate 130 that is configured to receive the inverted input signal A', the voltage on the capacitor 128 at the node C, and an input from the set circuit 102. The And gate 130 may have an associated input threshold, above which is defined as a logic "1" or high, and below which is defined as a logic "0" or low. The output of the And gate 130 is a reset signal that may be used in conjunction with the set signal, for example, with other logic circuits (e.g., flip-flop circuit) as will be appreciated by one skilled in the art.

The input signal A may generally include "long" pulse signals and "short" pulse signals. The pulse signals may be positive or negative. Generally speaking, a "long" pulse signal, as used herein, is a pulse signal having a transition duration that is slower than the charging speed of the capacitors 114 and 128. A "short" pulse signal, as used herein, may include a pulse signal having a transition duration that is faster than the charging speed of the capacitors 114 and 128. The physical characteristics of the PMOS transistors 108 and 122 may be adjusted relative to the NMOS transistors 110 and 124 to provide faster switching speeds for the PMOS transistors 108 and 122, for example, by increasing the channel width of the PMOS transistors 108 and 122. More particularly, the channel width of the PMOS transistors 108 and 122 may be made wider than the channel width of the NMOS transistors 110 and 124 to improve (decrease) the propagation delay associated with the PMOS transistors 108 and 122.

In the example of FIG. 1, the SR circuit 100 includes a cross-coupling circuit between the set circuit 102 and the reset circuit 104 to significantly reduce or eliminate dropped reset signals, thus significantly increasing the probability that the SR circuit 100 generates set and reset signal pairs when the input signal A is a short pulse signal.

In the example of FIG. 1, the cross-coupling circuit includes a first cross-coupling circuit 132 to couple the node B of the set circuit 102 to the And gate 130 of the reset circuit 104, and a second cross-coupling circuit 134 to couple the node C of the reset circuit 104 to the And gate 116 of the set circuit 102. The first cross-coupling circuit 132 may include a hysteresis circuit 136 having a threshold that is greater than a threshold of the And gate 130. The higher threshold of the hysteresis circuit 136 helps ensure that when the input signal A transitions from low to high and the signal value at the node B is not yet above the threshold of the hysteresis circuit 136, the reset pulse may not be generated but the set pulse will be generated. The second cross-coupling circuit 134 may also a include hysteresis circuit 138 having a threshold that is greater than a threshold of the And gate 116. The higher threshold of hysteresis circuit 138 helps ensure that when the input signal A transitions from high to low and the signal value at the node C is not yet above the threshold of the hysteresis circuit 138, the set pulse may not be generated but the reset pulse will be generated. In applications where the set and reset pulses are controlling a latch circuit (e.g., RS latch circuit, not shown), this may be more desirable since an output of the latch circuit will be the same as the input signal A.

In the example of FIG. 1, the inputs to the And gate 116 are the signal from the cross-coupling circuit 134 (i.e., the voltage value at the node C), the input signal A, and the voltage value at the node B. Similarly, the inputs to the And gate 130 are the signal from the cross-coupling circuit 132 (i.e., the voltage value at the node B), the inverted input signal A', and the voltage value at the node C. Therefore, the reset signal is based on the state information of both the set circuit 102 and the reset circuit 134 and, similarly, the set signal is based on the state information of both the set circuit 102 and the reset circuit 104. This circuit topology enables the SR circuit 100 to ensure that both the set signal and the reset signal are generated in pairs, or that a reset signal is always generated for positive input signals or that a set signal is always generated for negative input signals.

Figure 2A:
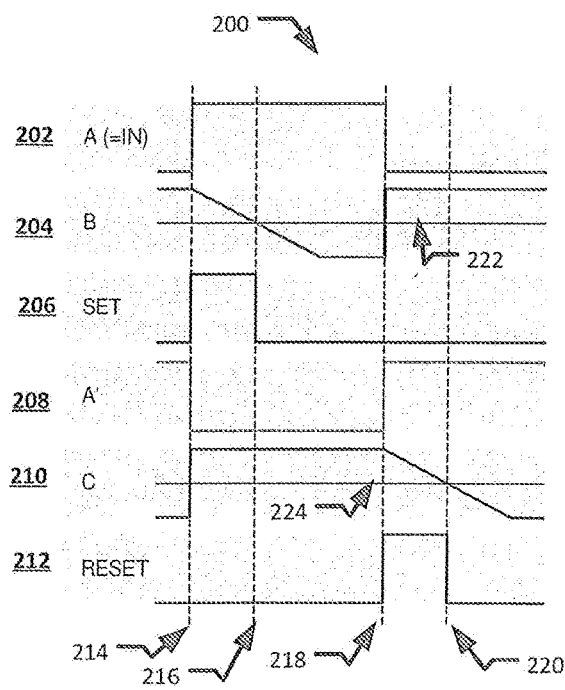
FIGS. 2A and 2B show example waveforms of signals of the set and reset pulse generator circuit of FIG. 1 in accordance with an embodiment of the present invention.
Figure 2B:
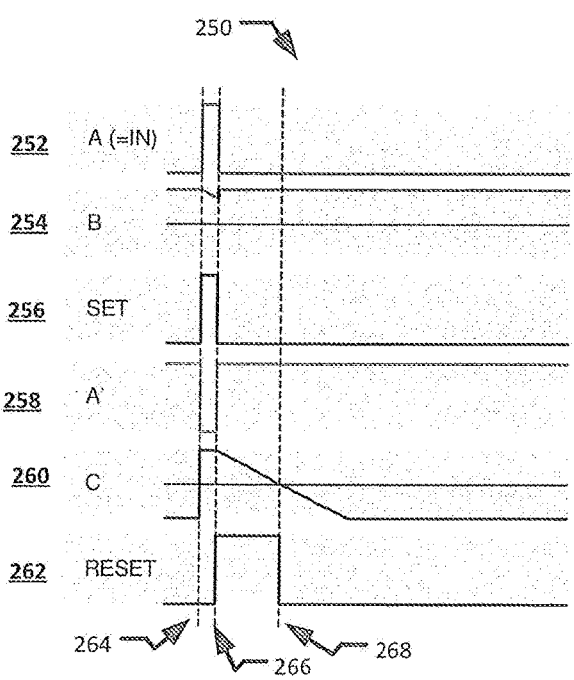

FIGS. 2A and 2B show example waveforms of signals of the SR circuit 100 of FIG. 1 in accordance with an embodiment of the present invention. For convenience, the waveforms of FIGS. 2A and 2B are circuit responses to positive input pulses.

FIG. 2A depicts operational waveforms 200 for various signals when the input signal A is a long pulse signal. Waveform 202 illustrates an example of a long positive input signal A. Waveform 204 illustrates an example of the charge on the capacitor 114 at the node B. Waveform 206 illustrates an example of the resultant set signal at the output of the And gate 116. Waveform 208 illustrates an example of the inverted (complementary) input signal A'. Waveform 210 illustrates an example of the charge on the capacitor 128 at the node C, and waveform 212 illustrates an example of the resultant reset signal at the output of the And gate 130.

In the example of FIG. 2A, at time 214, the input signal A 202 transitions from low to high and the voltage at the node B 204 begins to decrease. The inverted input signal A' 208 transitions from high to low, and the voltage on the capacitor 128 transitions from low to high at the node C 210. Since the voltage at the node C transitions from a low state to a high state (charging) faster than from a high state to a low state (discharging), the set signal 206 is at a high state at the output of the And gate 116, as the inputs to the And gate 116 are in a high state. At time 216, the voltage value at the node B 204 decreases below threshold 222, and the set signal 206 transitions from high to low. The threshold value 222 may be based on, for example, the input requirements of the And gate 116. At time 218, the input signal A 202 transitions from a high state to a low state and the inverted input signal A' 208 transitions from a low state to a high state. The voltage on the capacitor 114 transitions from low to high at the node B 204. Since the voltage at the node B transitions from a low to high state (charging) faster than a high to low state (discharging), the reset signal 212 is at a high state at the output of And gate 130, as the inputs to And gate 130 are in a high state.

FIG. 2B depicts operational waveforms 250 for various signals when the input signal A is a short pulse signal. Waveform 252 illustrates an example of a short positive input signal A. Waveform 254 illustrates an example of the charge on the capacitor 114 at the node B. Waveform 256 illustrates an example of the resultant set signal at the output of the And gate 116. Waveform 258 illustrates an example of the inverted (complementary) input signal A'. Waveform 260 illustrates an example of the charge on the capacitor 128 at the node C, and waveform 262 illustrates an example of the resultant reset signal at the output of the And gate 130.

In the example of FIG. 2B, at time 264, the input signal A 252 transitions from low to high and the voltage at the node B 254 begins to decrease. The inverted signal A' 258 transitions from high to low, and the voltage on the capacitor 128 transitions from low to high at the node C 260. Since the voltage at the node C transitions from a low state to a high state (charging) faster than from a high state to a low state (discharging), the set signal 256 is at a high state at the output of the And gate 116, as the inputs to the And gate 116 are in a high state. At time 266, the input signal A 252 transitions from a high state to a low state, and therefore the set signal 256 also transitions from a high state to a low state. However, the voltage value at the node B does not drop below the threshold, since the input signal A is a short pulse signal and therefore the capacitor 114 does not fully discharge. Also at time 266, the reset signal 262 transitions from a low state to a high state since the voltage on the capacitor 128 is charged above the threshold, the voltage at the node B remains high and the inverted input signal A' 258 transitions from a low state to a high state. At time 268, the reset signal 262 transitions from the high state to the low state as the voltage at the node C 260 decreases below the threshold.

Figure 3:
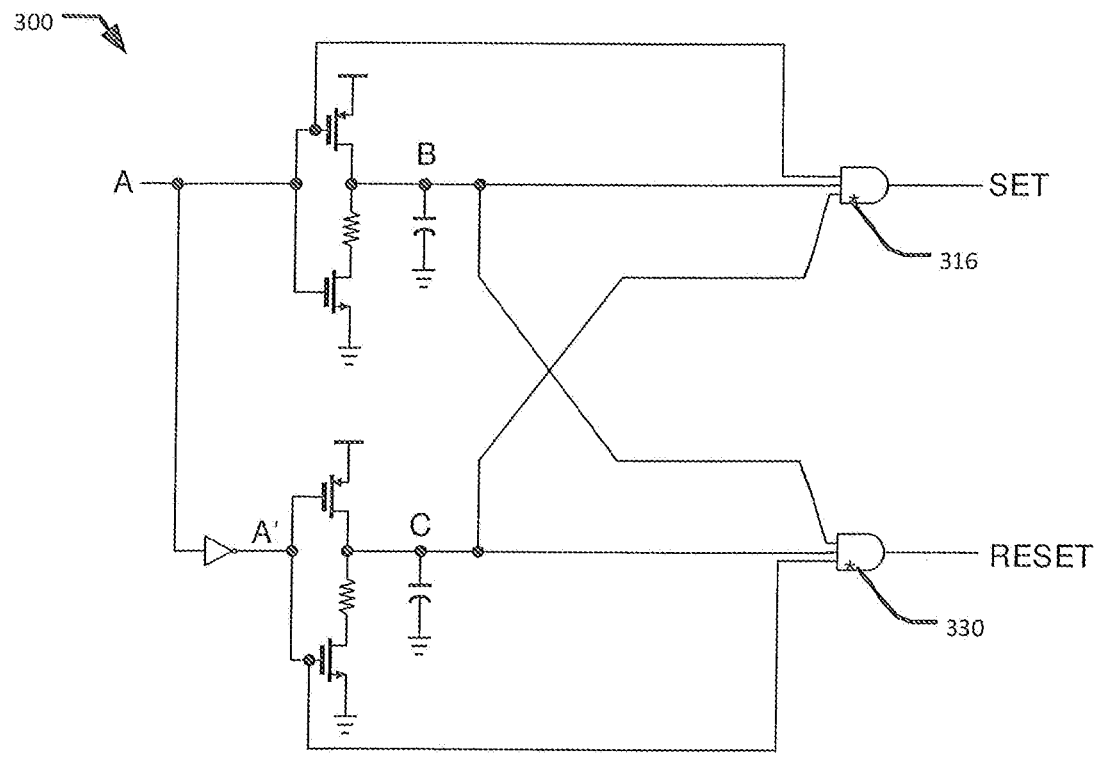
FIG. 3 shows a schematic diagram of a set and reset pulse generator circuit in accordance with an embodiment of the present invention.

FIG. 3 shows a schematic diagram of a set and reset pulse generator circuit 300 ("SR circuit 300") in accordance with an embodiment of the present invention. The SR circuit 300 is similar to the SR circuit 100 of FIG. 1, except that the cross-coupling circuits 132 and 134 do not have the hysteresis circuits 136 and 138. In the example of FIG. 3, the cross-coupling input thresholds of the And gates 316 and 330 may be greater than the other two respective inputs to the And gates, so that the signal value at the node C reaches the threshold of the And gate 330 before the threshold of the And gate 316.

Figure 4:
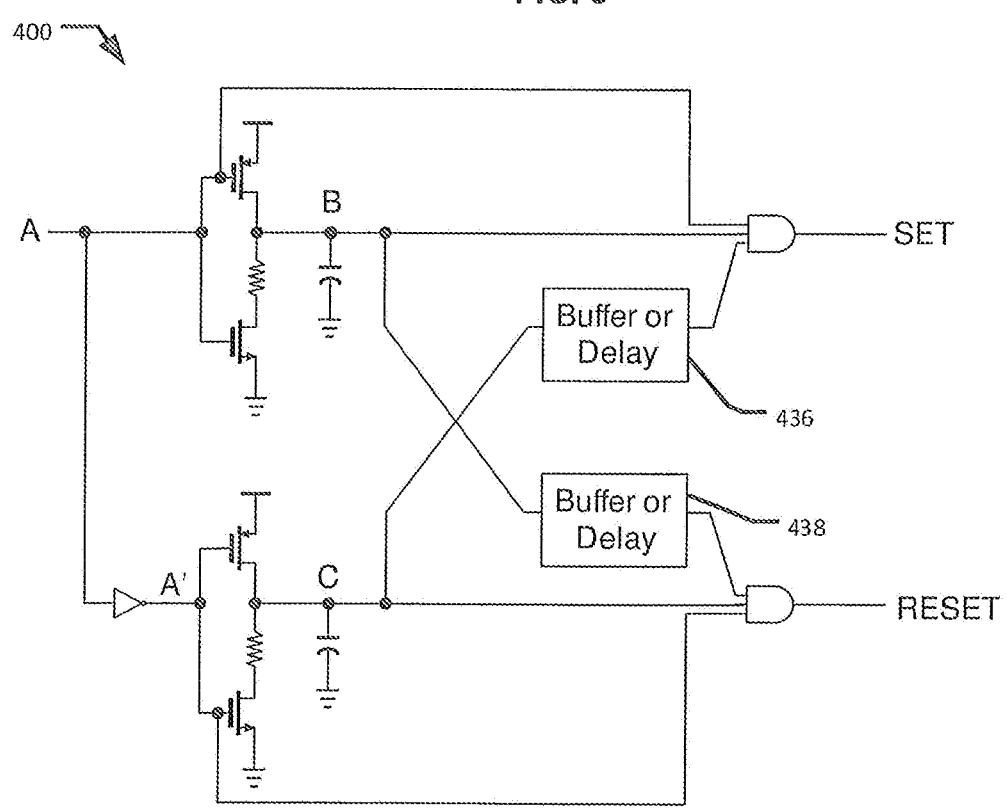
FIG. 4 shows a schematic diagram of a set and reset pulse generator circuit in accordance with an embodiment of the present invention.

FIG. 4 shows a schematic diagram of a set and reset pulse generator circuit 400 ("SR circuit 400") in accordance with an embodiment of the present invention. The SR circuit 400 is similar to the SR circuit 100 of FIG. 1, except that the cross-coupling circuits 132 and 134 may include respective buffer and/or delay circuits 436 and 438. The buffer and/or delay circuits 436 and 438 may include, for example, delay buffer circuit, Schmitt trigger circuit, hysteresis buffer circuit, a series of inverters and/or buffers, gate circuit with input threshold, etc., and/or any combination of delays and/or buffers.

The component values of the SR circuits 100 (FIG. 1), 300 (FIG. 3), and 400 (FIG. 4) may be approximately the same, e.g., symmetrical, so that the set and reset signals generated are not weighted. In one example, to generate a set signal having a 300 ns set pulse and a reset signal having a 300 ns reset pulse, the PMOS transistors 108 and 122 may each have an approximate width of 80 µm and a length of 1.4 µm, the NMOS transistors 110 and 124 may each have an approximate width of 20 µm and a length of 1.4 µm, the resistive elements 112 and 126 may each have a resistance of approximately 100 kOhms, and the capacitors 114 and 128 may each have a capacitance of 2 pF. In other embodiments, to provide "set dominant" signal generation or "reset dominant" signal generation, the set circuit may be weighted differently than the reset circuit, for example, by using different component values for the set and reset pulse generator circuits.

Set and reset pulse generator circuits and methods of operating same have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:
1. A set and reset pulse generator circuit, comprising:
a set circuit that is configured to receive an input signal, to generate a voltage on a node of the set circuit using the input signal, and to generate a set pulse in accordance with the input signal, the voltage on the node of the set circuit, and a voltage on a node of a reset circuit;
the reset circuit that is configured to receive the input signal, to generate the voltage on the node of the reset circuit using the input signal, and to generate a reset pulse in accordance with the input signal, the voltage on the node of the set circuit, and the voltage on the node of the reset circuit;
a first cross-coupling circuit that is configured to couple the voltage on the node of the set circuit to the reset circuit; and a second cross-coupling circuit that is configured to couple the voltage on the node of the reset circuit to the set circuit.

2. The set and reset pulse generator circuit of claim 1, wherein the set circuit is configured to charge a first capacitor using the input signal to generate the voltage on the node of the set circuit, and to generate the set pulse by performing a logical operation on the input signal, the voltage on the first capacitor, and the voltage on the node of the reset circuit.

3. The set and reset pulse generator circuit of claim 2, wherein the reset circuit is configured to invert the input signal to generate an inverted input signal, to charge a second capacitor using the inverted input signal to generate the voltage on the node of the reset circuit, and to generate the reset pulse by forming a logical operation on the inverted input signal, the voltage on the first capacitor, and the voltage on the second capacitor.

4. The set and reset pulse generator circuit of claim 2, wherein the set circuit comprises a first inverter circuit that is configured to charge the first capacitor in accordance with the input signal, the first capacitor, and an And gate that is configured to perform the logical operation to generate the set pulse.

5. The set and reset pulse generator circuit of claim 4, wherein the reset circuit comprises an inverter buffer that is configured to invert the input signal to generate an inverted input signal, a second capacitor, a second inverter circuit that is configured to charge the second capacitor in accordance with the inverted input signal, and an And gate that is configured to perform a logical And operation on the inverted input signal, the voltage on the first capacitor, and the voltage on the second capacitor to generate the reset pulse.

6. The set and reset pulse generator circuit of claim 5, wherein the first inverter circuit comprises a first pull-up transistor and a first pull-down transistor that are complementary switched in accordance with the input signal, and the second inverter circuit comprises a second pull-up transistor and a second pull-down transistor that are complementary switched in accordance with the inverted input signal.

7. The set and reset pulse generator circuit of claim 1, wherein the first cross-coupling circuit comprises a first hysteresis circuit and the second cross-coupling circuit comprises a second hysteresis circuit.

8. The set and reset pulse generator circuit of claim 1, wherein the first cross-coupling circuit comprises a first delay circuit and the second cross-coupling circuit comprises a second delay circuit.

9. A set and reset pulse generator circuit, comprising:
a first inverter circuit that is configured to receive an input signal, and to control a switching operation of a first transistor pair in accordance with the input signal to charge a first capacitor to generate a first voltage signal;
a second inverter circuit that is configured to control a switching operation of a second transistor pair in accordance with an inverted input signal to charge a second capacitor to generate a second voltage signal;
a first output circuit that is configured to generate a set signal based on the input signal, the first voltage signal, and the second voltage signal;
a second output circuit that is configured to generate a reset signal based on the inverted input signal, the first voltage signal, and the second voltage signal;
a first cross-coupling circuit that is configured to couple the first voltage signal to the second output circuit; and a second cross-coupling circuit that is configured to couple the second voltage signal to the first output circuit.

10. The set and reset pulse generator circuit of claim 9, wherein the first cross-coupling circuit comprises a first hysteresis circuit that provides hysteresis to the first voltage signal, and the second cross-coupling circuit comprises a second hysteresis circuit that provides hysteresis to the second voltage signal.

11. The set and reset pulse generator circuit of claim 9, wherein the first cross-coupling circuit further comprises a first delay circuit that delays the first voltage signal by a first delay value, and wherein the second cross-coupling circuit comprises a second delay circuit that delays the second voltage signal by a second delay value.

12. The set and reset pulse generator circuit of claim 9, the wherein the first cross-coupling circuit comprises a first buffer circuit, and the second cross-coupling circuit comprises a second buffer circuit.

13. The set and reset pulse generator circuit of claim 9, wherein the first transistor pair comprises a first pull-up transistor and a first pull-down transistor, and the second transistor pair comprises a second pull-up transistor and a second pull-down transistor.

14. The set and reset pulse generator circuit of claim 13, wherein the first pull-up transistor is a PMOS transistor and the first pull-down transistor is an NMOS transistor with the first pull-up transistor having a channel width that is wider than a channel width of the first pull-down transistor, and
wherein the second pull-up transistor is a PMOS transistor and the second pull-down transistor is an NMOS transistor with the second pull-up transistor having a channel width that is wider than a channel width of the second pull-down transistor.

15. The set and reset pulse generator circuit of claim 9, wherein the first output circuit comprises a first And gate that performs a logical And operation on the input signal, the first voltage signal, and the second voltage signal to generate the set signal.

16. The set and reset pulse generator circuit of claim 15, wherein the second output circuit comprises a second And gate that performs a logical And operation on the inverted input signal, the first voltage signal, and the second voltage signal to generate the reset signal.

17. A method of operating a set and reset pulse generator circuit, the method comprising:
receiving an input signal;
generating a first voltage signal by controlling a switching operation of a first transistor pair in accordance with the input signal to charge a first capacitor that provides the first voltage signal;
inverting the input signal to generate an inverted input signal;
generating a second voltage signal in accordance with the inverted input signal;
generating a set signal based on the input signal, the first voltage signal, and the second voltage signal; and
generating a reset signal that is complementary to the set signal based on the inverted input signal, the first voltage signal, and the second voltage signal.

18. The method of claim 17, wherein generating the second voltage signal comprises:
controlling a switching operation of a second transistor pair in accordance with the inverted input signal to charge a second capacitor that provides the second voltage signal.

19. The method of claim 18, wherein the set signal is generated by performing a logical And operation on the input signal, the first voltage signal, and the second voltage signal, and wherein the reset signal is generated by performing a logical And operation on the inverted input signal, the first voltage signal, and the second voltage signal.

* * * * *